(12) United States Patent
Beaulaton et al.

(10) Patent No.: US 7,880,516 B2
(45) Date of Patent: Feb. 1, 2011

(54) METHOD FOR NOISE REDUCTION IN A PHASE LOCKED LOOP AND A DEVICE HAVING NOISE REDUCTION CAPABILITIES

(75) Inventors: Hugues Beaulaton, Toulouse (FR); Stephane Colomines, Toulouse (FR); Philippe Gorisse, Brax (FR)

(73) Assignee: Freescale Semiconductor, Inc., Austin, TX (US)

( * ) Notice: Subject to any disclaimer, the term of this patent is extended or adjusted under 35 U.S.C. 154(b) by 12 days.

(21) Appl. No.: 11/910,062

(22) PCT Filed: Mar. 31, 2005

(86) PCT No.: PCT/EP2005/004647

§ 371 (c)(1), (2), (4) Date: Sep. 28, 2007

(87) PCT Pub. No.: WO2006/102925

PCT Pub. Date: Oct. 5, 2006

(65) Prior Publication Data

US 2008/0265958 A1   Oct. 30, 2008

(51) Int. Cl.
*H03L 7/06* (2006.01)
(52) U.S. Cl. .................. 327/156; 327/147; 327/158; 327/161; 331/16; 331/17; 331/34
(58) Field of Classification Search .................. 327/156; 331/16, 34, 17
See application file for complete search history.

(56) References Cited

U.S. PATENT DOCUMENTS 5,907,253 A   5/1999   Davis et al.

6,064,272 A   5/2000   Rhee (Continued)

FOREIGN PATENT DOCUMENTS

EP   1434352 A1   6/2004

(Continued)

OTHER PUBLICATIONS

Rhee; "TP 12.2 A 1.1GHz CMOS Fractional-N Frequency Synthesizer with a 3b 3rd-Order ΔΣ Modulator" 2000 IEEE International Solid-State Circuits Conference.

*Primary Examiner*—Lincoln Donovan
*Assistant Examiner*—John W Poos

(57) ABSTRACT

A method for reducing noise in a device that includes at least one phase locked loop (PLL), the method includes: adjusting at least one adjustable component of a PLL such as to determine a time shift; modulating a frequency divider such as to generate a modulation noise within a modulation noise period and to provide a frequency divided signal; introducing the time shift between the modulation noise period and a measurement period; and measuring during a measurement period a difference between a reference signal and the frequency divided signal. A device that includes a phased locked loop. The phase locked loop (PLL) includes: a frequency divider, adapted to receive an output signal from a controlled oscillator and to provide a divided frequency signal; a modulator, adapted to affect at least one frequency division characteristic and to introduce a modulation noise during a modulation noise period, a phase detector, adapted to measure, during a measurement period, a difference between a reference signal and the frequency divided signal; and an adjustable delay unit adapted to affect an adjustable time shift between the modulation period and the measurement period.

12 Claims, 7 Drawing Sheets

U.S. PATENT DOCUMENTS

| | | |
|---|---|---|
| 6,359,950 B2 * | 3/2002 | Gossmann et al. .......... 375/376 |
| 6,553,089 B2 | 4/2003 | Huh et al. |
| 6,559,698 B1 * | 5/2003 | Miyabe ..................... 327/157 |
| 6,603,360 B2 | 8/2003 | Kim et al. |
| 2001/0036240 A1 | 11/2001 | Gossmann et al. |
| 2003/0025565 A1 | 2/2003 | Takeda et al. |
| 2004/0017261 A1 | 1/2004 | Soumyanath et al. |
| 2004/0198290 A1 | 10/2004 | Chien |
| 2008/0129352 A1 * | 6/2008 | Zhang ....................... 327/157 |

FOREIGN PATENT DOCUMENTS

| | | |
|---|---|---|
| WO | 2004051855 A2 | 6/2004 |

* cited by examiner

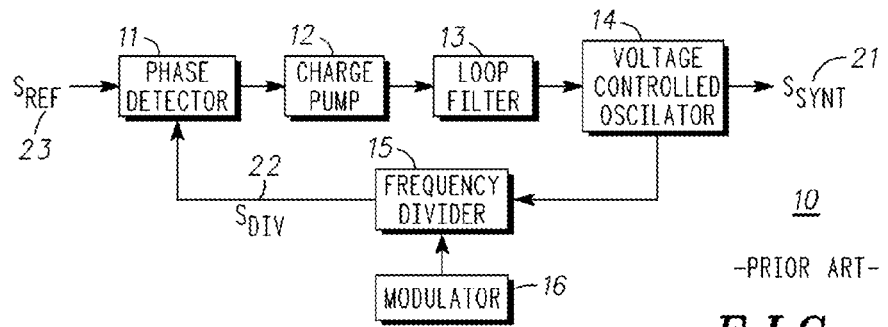
FIG. 1 —PRIOR ART—
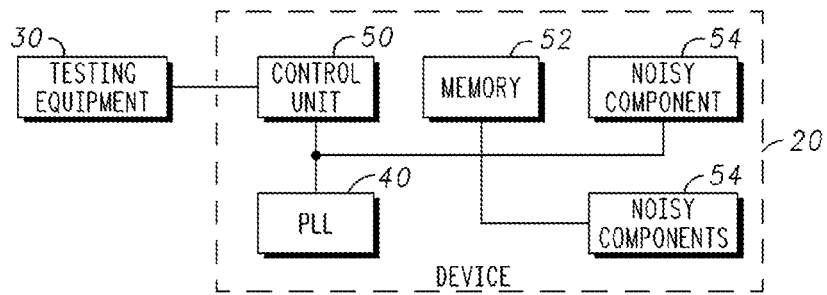
FIG. 2
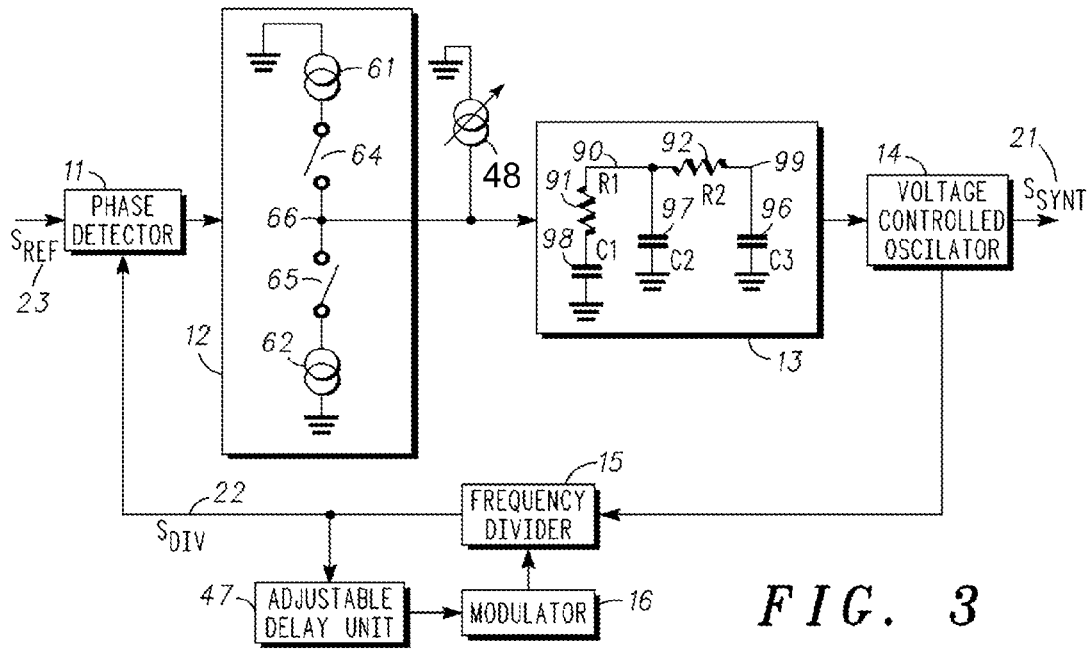
FIG. 3

METHOD FOR NOISE REDUCTION IN A PHASE LOCKED LOOP AND A DEVICE HAVING NOISE REDUCTION CAPABILITIES

FIELD OF THE INVENTION

The present invention relates to methods for reducing noise in a phase locked loop (PLL) and a device having noise reduction capabilities.

BACKGROUND OF THE INVENTION

Fractional-N PLLs are used in many devices. They are usually included in frequency synthesizers, data recovery components, clock recovery components and the like. Many modern telecommunication device, such as radios include fractional-N PLLs.

The following patents and patent applications, all being incorporated herein by reference, provide a brief overview of some prior art fractional-N PLLs: U.S. Pat. No. 6,603,360 of Kim et al., titled "Phase locked loop circuit for a fractional-N frequency synthesizer"; U.S. Pat. No. 6,553,089 of Huh et al., titled "Fractional-N frequency synthesizer with fractional compensation method"; U.S. patent application publication number 2004/0017261 of Soumyanath et al., titled "Input jitter attenuation in a phase-locked loop", and PCT patent application publication number WO2004/051855A2 of Beaulaton et al, titled "Arrangement, phase locked loop and method for noise shaping in a phase locked loop".

FIG. 1 illustrates a prior art fractional-N PLL 10. PLL 10 can generate a synthesized signal $S_{synt}$ that has a synthesized frequency $F_{synt}$ that is a fractional multiple of a reference frequency $F_{ref}$ of a reference signal $S_{ref}$. Each synthesized signal is generated by smoothing (or averaging) a sequence that at least two frequency divided signals that have different frequencies. In other words, the frequency divider alters the frequency division ratio and outputs a frequency hopping signal $S_{div}$. While the loop filter of the PLL averages the frequency hopping sequence to provide the required signal. If, for example, a frequency divider is connected to a K-bit modulator, the sequence includes up to $2^K$ different frequencies.

PLL 10 includes a frequency phase detector that in turn includes a phase detector 11 and a charge pump 12. The charge pump 12 is followed by a loop filter 13 that in turn is followed by a voltage controlled oscillator (VCO) 14.

The VCO 14 generates the output signal of the PLL 10 which is the synthesized signal $S_{synt}$ 21. A portion of $S_{synt}$ is sent to a feedback loop that includes a frequency divider 15 and a frequency divider modulator 16.

A frequency divided signal $S_{div}$ 22 is sent from the frequency divider 15 to the phase detector 11. This frequency divided signal is also used to clock the frequency divider modulator 16. $S_{div}$ 22 has a frequency of $F_{div}$. $F_{div}=F_{synt}/N$ and N is an the frequency division ratio.

The phase detector 11 receives a stable reference signal $S_{ref}$ 23 having a frequency of $F_{ref}$, and also receives $S_{div}$ 22. It outputs one or more phase error signals that represents the phase difference between $S_{div}$ 22 and $S_{ref}$ 23. The charge pump 12 receives error signals from the phase detector 11 and generates current pulses representative of the phase difference. The output signal of the charge pump is denoted $S_{cp}$ 24.

These current pulses are provided to the loop filter 13 that in turn performs a smoothing operation to provide a control signal $S_{tune}$ 25 to the VCO 14. The synthesized frequency $F_{synt}$ is responsive to the amplitude of $S_{tune}$ 25.

The PLL dynamic, and especially the smoothing characteristics of the loop filter 13 average multiple division ratios to provide a required $F_{synt}$.

There are various types of modulators 16, such as multi modulus dividers and the like. A very common modulator uses sigma delta techniques to perform noise shaping of the noise introduced by the modulator 16. One prior art sigma delta modulator is described in PCT patent application publication number WO2004/051855A2.

A typical charge pump 12 includes a current source, a current sink and multiple switches that connect only one of said current source and current sink to the loop filter 13. The current source, when connected to the loop filter, can pump up the voltage of the loop filter 13. The current sink, when connected to the loop filter 13, can pump down the voltage of the loop filter 13.

A typical prior art phase frequency detector has a dead zone near zero phase difference. Such a detector is not able to properly respond to minor phase differences between $S_{div}$ 22 and $S_{ref}$ 23. If the phase difference between these signals is small the PLL 10 introduces a jitter to $S_{synt}$ 21.

In order to reduce the effect of the dead zone various solutions were provided. "A simple precharged CMOS phase frequency detector", H. Johansson, IEEE Journal of Solid State Circuits, Vol. 55, No. 2, February 1998, which is incorporated herein by reference, and "A 1.1-Ghz CMOS Fractional-N Frequency Synthesizer with 3-b Third-Order ΣΔModulator", W. Rhee, B. Song and A. Ali, IEEE Journal of Solid State Circuits, Vol. 35, No. 10. October 2000 describe a phase frequency detector that does not have a dead zone in its phase characteristics.

Another solution, very suitable for Frac-N PLLs, involves introducing a fixed trickle current to the charge pump 12. The fixed trickle current generates a fixed phase delay between $S_{ref}$ and $S_{div}$. Thus, even if the PLL is locked the charge pump is out of the dead zone.

The phase difference introduced by the fixed trickle current must be sufficiently long to allow very linear charge-pump response with regard to Frac-N modulation. If the charge pump operates in a non-linear zone (even for a fraction of the frequency hopping sequence) this non-linearity will turn into a low frequency noise, degrading in-band phase noise performance.

Frequency divider modulator 16 alters the frequency division ratio in synchronization with the pulses of the charge pump. The modulation is characterized by a strong digital activity generating noise that potentially couples in PLL sub-blocks. And disturbs the phase comparison process. In some prior art PLLs, the modulator activity is synchronized with the phase detection, and the generated noise directly affects the charge pump current pulses. The necessary linearity relationship between the Frac-N modulation and the charge pump current injection into the loop filter is then broken, and strong low frequency in-band noise arises on the synthesized signal Ssynt.

In addition, various components, including internal components of the PLL, components that do not belong to the PLL (such as transmitters, modulators, processors, I/O components, and the like) are also clocked by the rising edge or by the failing edge of the reference signal. The operation of such components also disturbs the phase comparison process and adds to the noise of the PLL.

Due to the complexity of modern devices and due to the complexity of noise generating mechanisms the noise characteristics of various systems are hard to predict or simulate.

Accordingly, using the clock signal as a trigger to multiple events does not necessarily provide adequate noise suppression.

There is a need to provide a method for noise reduction in a PLL and to provide a device that has noise reduction capabilities.

SUMMARY OF THE PRESENT INVENTION

A method for reducing noise in a phase locked loop (PLL) and a device having noise reduction capabilities, as described in the accompanying claims.

BRIEF DESCRIPTION OF THE DRAWINGS

The present invention will be understood and appreciated more fully from the following detailed description taken in conjunction with the drawings in which:

FIG. 1 illustrates a prior art fractional-N PLL;

FIG. 2 illustrates a device that is connected to testing equipment, according to an embodiment of the invention;

FIG. 3, FIG. 4 and FIG. 6 illustrate various phase locked loops, according to various embodiments of the invention;

DETAILED DESCRIPTION OF THE DRAWINGS

Figure 4:
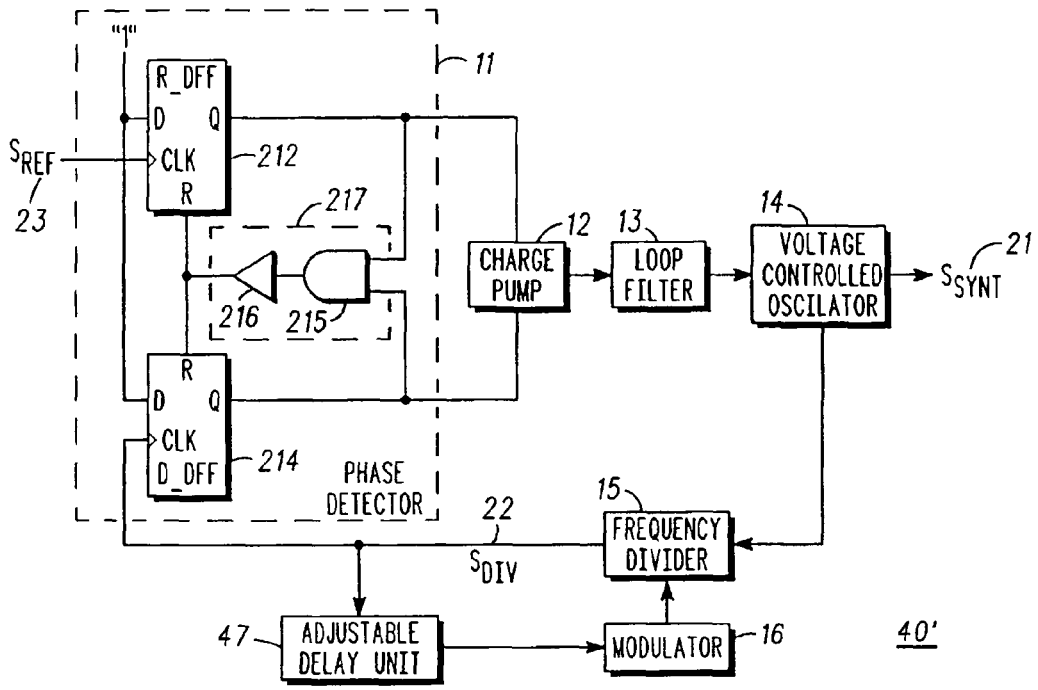

The following detailed description includes non-limiting examples of various embodiments of the invention. The particular terms and expressions employed and the particular structural and operational details disclosed in the detailed description and accompanying drawings are for illustrative purposes only and are not intended to in any way limit the scope of the invention as described in the appended claims.

Although the following description refer to a voltage controlled oscillator (VCO) the invention can be applied mutatis mutandis to other types of oscillators such as a current controlled oscillator (ICO) or a digital controlled oscillator (DCO).

The invention provides a device that includes one or more phased locked loop (PLL). The device can be a radio, a cellular device, a personal data accessory, a communication receiver and the like. Conveniently, such a device include at least one more noisy components such as but not limited to transmitters, core processors, switches, modulators, PLLs and the like.

A PLL includes a phase detector that performs phase detection within a detection period. Phase detectors that have different configurations can have different detection periods. Some phase detectors are responsive to rising edges of the compared signals, while some phase detectors are responsive to the falling edges of the compares signals.

A trickle current, as well as a frequency hopping pattern of $S_{div}$, affect the width and the timing of the measurement period. By providing an adjustable delay unit the modulation noise can be time shifted outside that period.

A measurement period is a period during which the phase detector measures the phase difference between two signals. If, for example, the phase detector measures the time difference between the rising edge of a reference signal and between the rising edge of a trailing frequency divided signal that the measurement period starts at the rising edge of the reference signal and ends at the rising edge of the frequency divided signal.

According to various embodiments of the invention the trickle current can also be responsive to the timing of noises generated by components that belong to the same device as the PLL but are not a part of the PLL. In some cases the trickle current can be optimized not only in response to the linearity of the charge pump but also in response to the affect of other noises on the performance of the PLL.

According to an embodiment of the invention an adjustable component within one PLL can be adjusted in response to modulation noise periods of other PLLs.

It is noted that in cases where the modulation can not be totally shifted outside the detection period of the phase detector then it can at least be shifted such as to minimize the overlap between the modulation and the detection periods. These cases can occur if, for example, the aggregate length of the detection period of the phase detector ($\Delta Tcp$) and the modulation noise period ($\Delta tnoise$) exceed the period ($\Delta tref$) of $S_{ref}$.

FIG. 2 illustrates a device 20 that is connected to testing equipment 30, according to an embodiment of the invention.

Device 20 includes at least one PLL 40, a control unit 50, memory 52, and additional noisy components collectively denoted 54. The control unit 50 is coupled to PLL 40, to memory 52 and to the noisy components 54. One or more of the noisy components 54 can receive the synthesized signal from the PLL 40 but this is not necessarily so. Conveniently, one of the additional noisy components is a second PLL (also denoted 54).

Conveniently, the time shift of the first PLL 40 is adjusted in response to a modulation noise period of the second PLL 54.

Conveniently, a time shift introduced between a measurement period of the second PLL 54 and a modulation noise period of the second PLL 54 is responsive to the modulation noise period of the first PLL 40.

The testing equipment 30 is able to analyze the synthesized signal $S_{synt}$ 21 of the PLL 40. The testing equipment 30 interacts with control unit 50 such as to adjust an adjustable trickle current source 48 and to set the delay time of an adjustable delay unit 47 of PLL 40. Conveniently, the control unit 50 can set the current source 48 while the testing equipment 30 analyzes $S_{synt}$ in order to detect low frequency noises that indicate that the charge pump 42 of PLL 40 operates in a non-linear zone. Once the trickle current source 48 is adjusted the control unit 50 sets the adjustable delay unit 47 to provide a certain delay period, the testing equipment 30 analyze $S_{synt}$ to determine the noise characteristics of said signal. Various delay periods can be tested until an optimal delay period is found.

Conveniently, various noisy components 54 can be activated in order to evaluate their influence on $S_{synt}$ and to determine the best delay period.

Conveniently, once optimal values of the trickle current and the delay period are detected they are stored in a predefined location within device 20. Conveniently, these values are fed to PLL 40 during the operation of device 20.

It is noted that device 20 can operate in various operational modes that are characterized by different noise characteristics. According to an embodiment of the invention the trickle current and delay period that are best fitted to each operational mode are found. When device 20 is activated the control unit 50 (or other component of device 20) can provide the PLL with the delay unit and trickle current values that fit the current operational mode of device 20.

FIG. 3 illustrate PLL 40 that has noise reduction capabilities, according to an embodiment of the invention.

PLL 40 differs from prior art PLL 10 by having adjustable delay unit 47 and adjustable trickle current source 48. They can introduce an adjustable time shift between the modulation period and the measurement period.

The adjustable current source 48 can have any configuration known in the art. It can, for example, include multiple current sources that are coupled in parallel to each other and can be opened in a selective manner such as to produce a desired current.

The charge pump 12 can have various configurations. For simplicity of explanation FIG. 3 illustrates a charge pump 11 that includes a current source 61, a current drain 62, a first switch 64, a second switch 65 and an input node 66. The first switch 64 is connected between the current source 61 and the input node 66. The second switch 65 is connected between the current drain 62 and the input node 66. The input node 66 is connected to input node 90 of loop filter 13. The adjustable current source 48 is connected to the input node 66 and provides a trickle current to the loop filter 13. This trickle current source can either source or sink current into the input node 66.

The adjustable delay unit 47 can have any configuration known in the art. An exemplary adjustable delay unit 47 is illustrated in FIG. 4.

Conveniently, $\{(\Delta Tcp+K*\Delta tref)\leq Tdelay\leq[(K+1)*\Delta tref]-\Delta tnoise\}$, whereas K is an integer that usually equals zero, whereas $\Delta Tcp$ is the length of the detection period of the phase detector, $\Delta tref$ is the period of the reference signal $S_{ref}$, and Tdelay is the delay period introduced by the adjustable delay unit 47.

It is noted that the adjustable delay unit 47 can be clocked by any signal of PLL 40, including $S_{synt}$ 21, or $S_{div}$ 22 or a derivative of these signals.

According to another embodiment of the invention PLL 40 includes more than a single adjustable unit. For example, adjustable delay unit 47 is clocked by $S_{div}$ while another delay unit (not shown) can be clocked by $S_{synt}$. Both delay units or just one of them can provide the delay period.

FIG. 4 illustrates PLL 40', according to another embodiment of the invention.

PLL 40' includes a phase detector 11'. The phase detector 11' includes two D flip flops 212 and 214. Each flip has an input D input for receiving a "1" signal. The reference D-flip flop 212 is clocked by $S_{ref}$ 23 and a divided signal reference D-flip flop 214 is clocked by $S_{div}$ 22. Both D flip flops 212 and 214 have a reset input.

PLL 40' prevents the charge pump 12 from entering a dead zone by a phase detector 11' that has an internal adjustable delay circuit 217 that forces the phase detector 11' to generate simultaneous Vup and Vdown pulses even when there is no phase difference between $S_{ref}$ 23 and $S_{div}$ 22. The duration of the simultaneous pulses is determined by the delay period introduced by an adjustable delay circuit 217. The adjustable delay circuit 217 includes a OR gate 215 that received the Vup and Vdown control signals generated by a reference D-flip flop 212 and divided signal reference D-flip flop 214 and provides a signal to an adjustable delay circuit 216 that resets the two flip flops 212 and 214.

Referring back to FIG. 3, it is noted that after the end of the design stage or the integration stage of device 20, a certain control word is stored in memory 70 and can be sent to the adjustable delay unit 47 once the PLL 40 is activated.

The inventors used a third order loop filter 13 that had a bandwidth of about 100 Khz. It is noted that other loop filters can be used. Loop filter 13 includes an input node 90 and an output node 99. A second resistor R2 92 is serially connected between the input node 90 and the output node 99. A first resistor R1 91 and a first capacitor C1 98 are serially connected to each other between the input node 90 and the ground. A second capacitor C2 97 is connected between the input node 90 and the ground. A third capacitor C3 96 is connected between the output node 99 and the ground.

Figure 5:
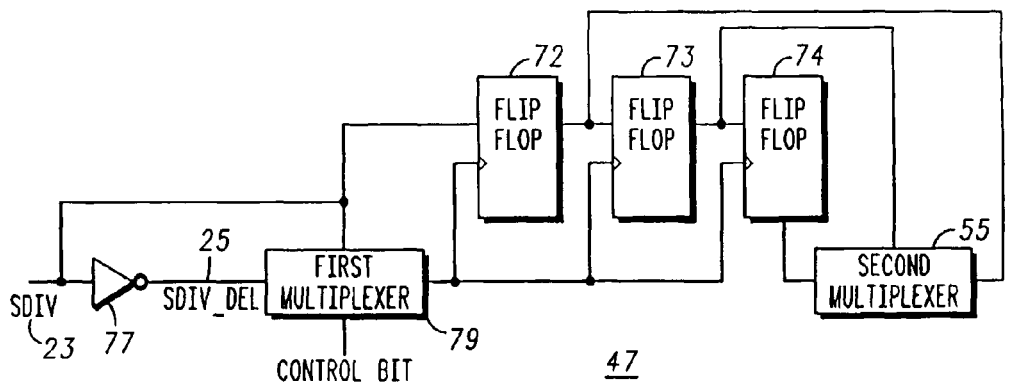
FIG. 5 illustrates an exemplary adjustable delay unit, according to an embodiment of the invention.

FIG. 5 illustrates an exemplary adjustable delay unit 47 according to an embodiment of the invention.

It is assumed that the adjustable delay unit 47 receives $S_{div}$ 23 as a clock signal, but other signals (including $S_{synt}$) can be provided to the adjustable delay unit 47.

Adjustable delay unit 47 includes an input inverter 77 that receives $S_{div}$ 23 and introduces a delay of half a cycle to provide a half cycle delayed signal denoted $S_{div\_del}$ 25. A first multiplexer 71 receives at one input $S_{div}$ 23 and at another input receives $S_{div\_del}$ 25. The first multiplexer 79 selects between these two signal in response to a control bit. The selected signal is provided as a clock signal to flip flops 72-74.

The three flip flops 72-74 are serially connected to each other such as to provide a delay path of three clock cycles. The output of each flip flop is also connected to a second multiplexer 78 that is capable of selecting between a partial delay path of one delay cycle (by selecting the output of first flip flop 72), a partial delay path of two clock cycles (by selecting the output of second flip flop 73), or the whole delay path (by selecting the output of the third flip flop 74).

The second multiplexer 78 is controlled by a control word that also determines the delay period. The control word can be stored at memory 70 and sent to PLL 30 during an initialization session.

As mentioned above, the selected delay should be long enough to ensure that the modulator is not clocked during the measurement period of the phase detector 11. Thus, the delay is conveniently larger than the maximum phase error in locked conditions.

Figure 6:
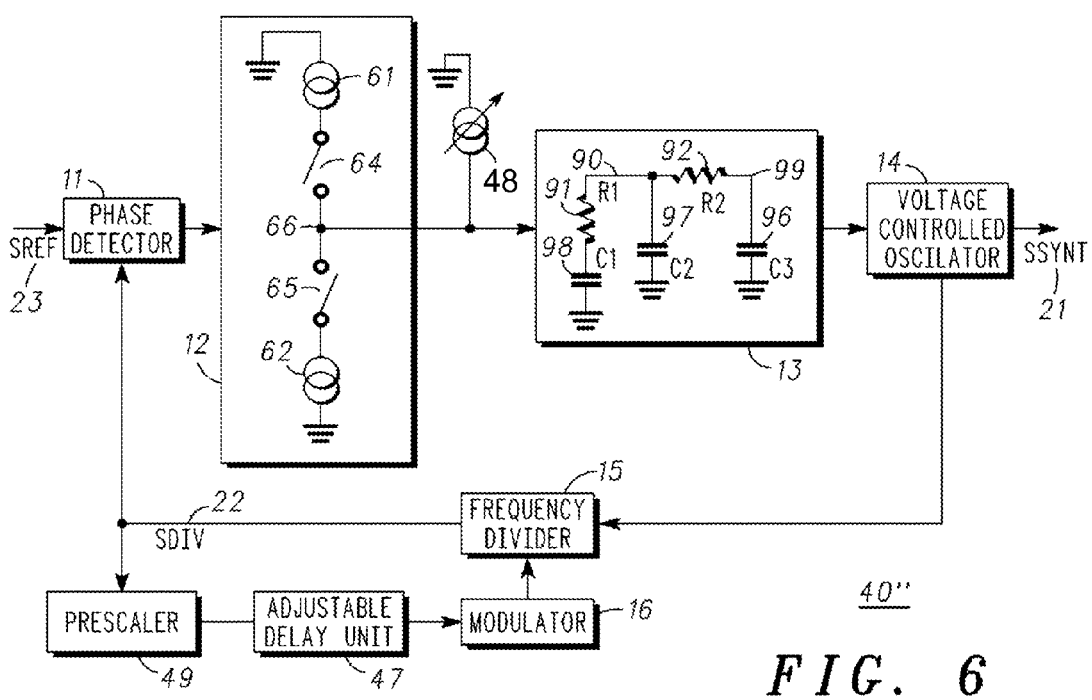

FIG. 6 illustrates a PLL 40'', according to a further embodiment of the invention. PLL 40'' includes an adjustable delay unit 47 that is preceded by a frequency reduction component such as prescaler 49. Prescaler 49 receives $S_{synt}$ and provides a reduced frequency signal $S_{indelay}$ to the adjustable delay unit 47. This reduced frequency signal allows to introduce a certain delay period while using less logic circuits in comparison to a delay unit that receives a higher frequency signal.

Figure 7:
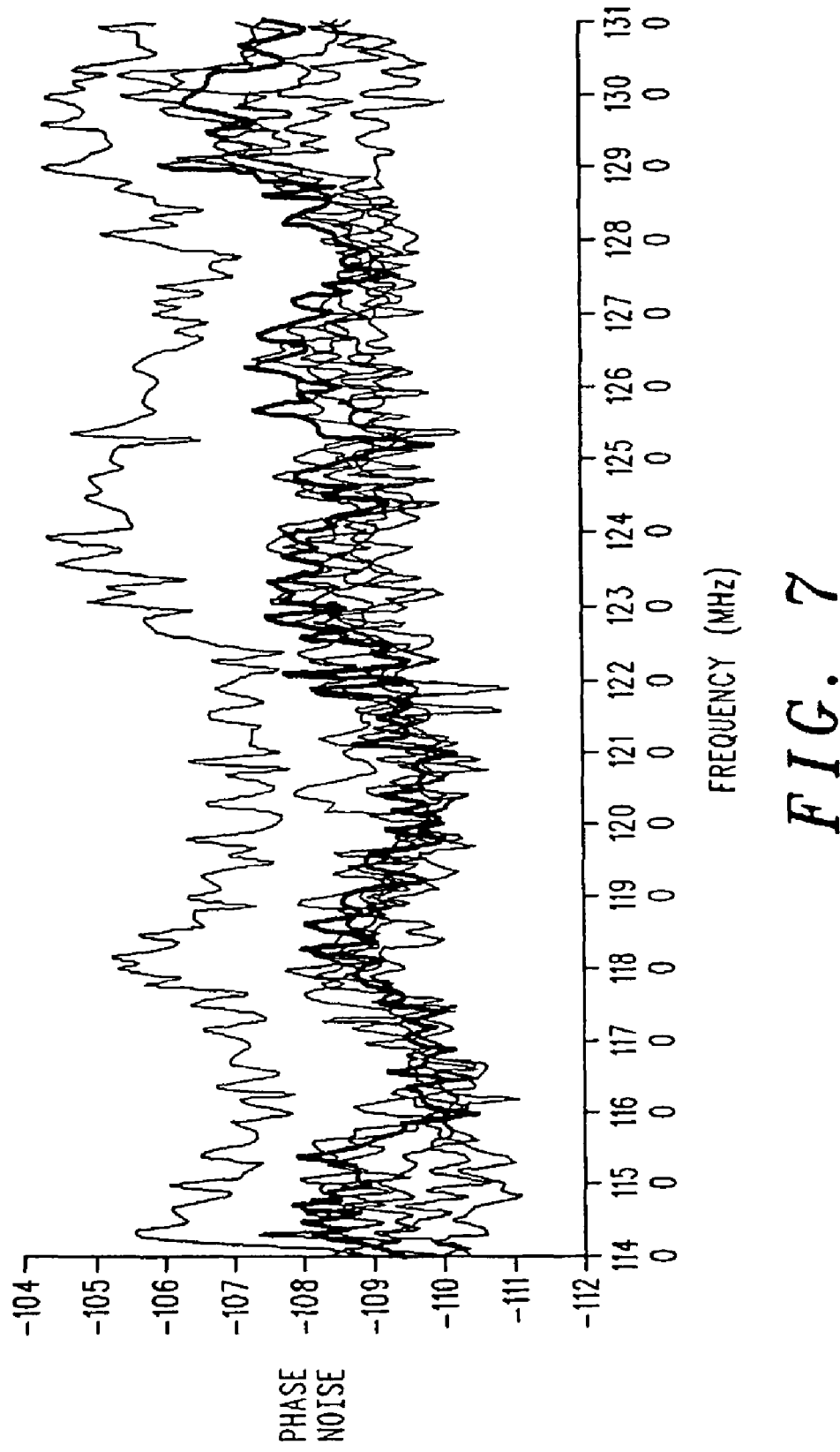
FIG. 7 illustrates various phase noises at seven exemplary adjustable delay periods.

FIG. 7 illustrates various phase noise at seven exemplary adjustable delay periods.

These noises were measured when the trickle current was set to 300 µA, and loop filter 33 was a third order loop filter with the following resistors and capacitors: R1=1.2 kΩ, C1=680 pF, C2=56 pF, R2=3.3 K2 kΩ, C3=$C_{vco}$. $C_{vco}$ is the input capacitance of the VCO and ranges between 80 pF to 100 pF.

The seven curves represent phase noises achieved with the following delay periods: Fvsel1—no delay, Fvsel2=delay of 0.125*$\Delta tref$, Fvsel3=delay of 0.25*$\Delta tref$, Fvsel4=delay of 0.375*$\Delta tref$, Fvsel5=delay of 0.5*$\Delta tref$, Fvsel6=delay of 0.625*$\Delta tref$, and Fvsel7=delay of 0.75*$\Delta tref$. Whereas $\Delta tref$ is the period of the reference signal.

Figure 8:
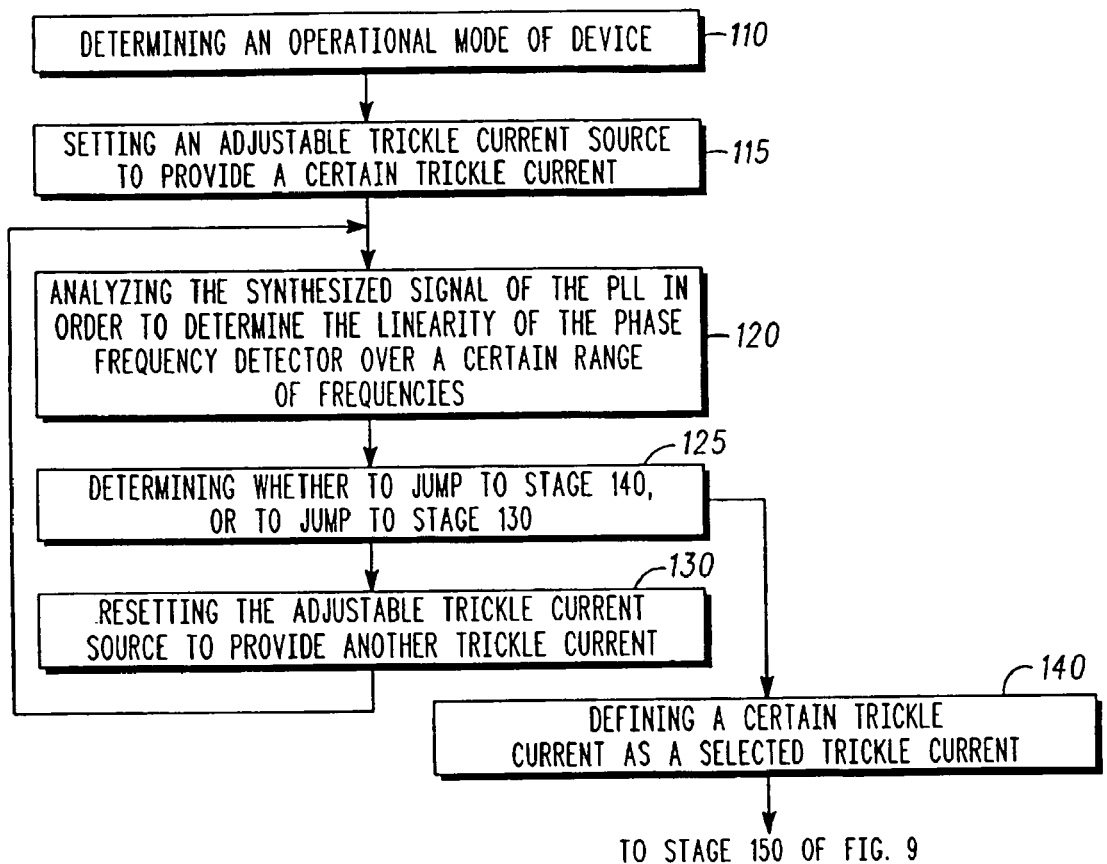
FIG. 8 and FIG. 9 illustrate a method for noise reduction, according to an embodiment of the invention.
Figure 9:
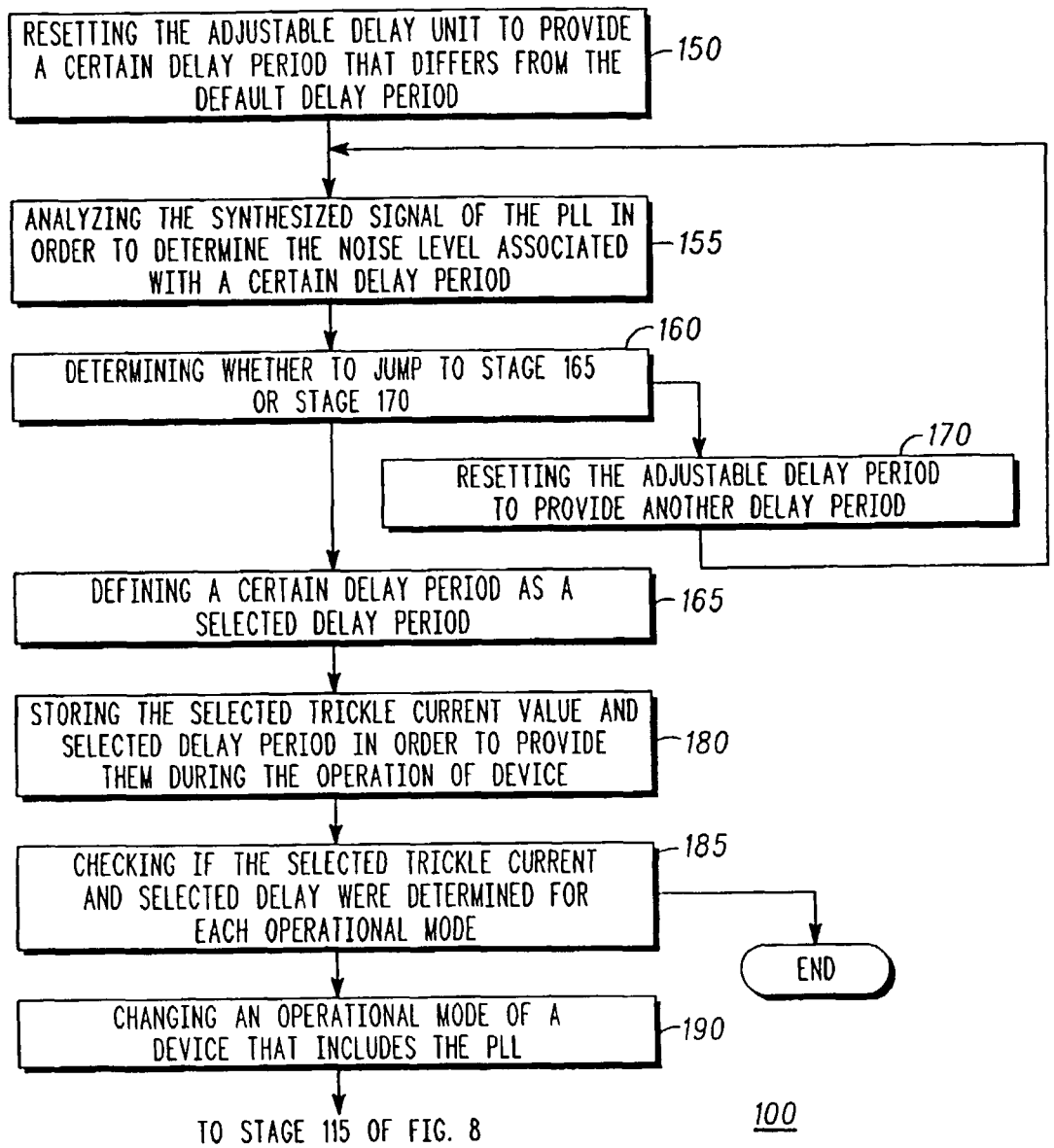

FIG. 8 and FIG. 9 illustrate method 100 for noise reduction, according to an embodiment of the invention. FIG. 8 illustrates stages 110-140, while FIG. 9 illustrates stages 150-190.

Method 100 is implemented during a configuration stage of device 20.

Method 100 starts by stage 110 of determining an operational mode of device 20. This stage is optional and can be skipped if the adjustable trickle current and the adjustable delay period are not adjusted per operational mode of the device.

Method 110 is followed by stage 115 of setting an adjustable trickle current source to provide a certain trickle current. This can be done by sending a control word to the adjustable trickle current source. Stage 115 usually includes setting the adjustable delay period to a certain default value. The trickle current can be positive or negative.

It is noted that the provision of for the trickle current can be replaced by providing an adjustable delay resetting unit inside the phase detector. In such a case, stages 110-140 can be modified such as to check different delay period of this adjustable delay.

Stage 115 is followed by stage 120 of analyzing the synthesized signal of the PLL in order to determine the linearity of the phase frequency detector over a certain range of frequencies. These frequencies are selected in response to an expected frequency hopping pattern of $S_{div}$.

Stage 120 is followed by stage 125 of determining whether to (a) jump to stage 140 that includes defining a certain trickle current as a selected trickle current, or (b) to jump to stage 130.

The determination of stage 125 can be responsive to a certain control criterion. This control criterion can reflect the amount of previous iterations, the linearity of the phase detector, whether the whole frequency range was tested and the like.

Stage 130 includes resetting the adjustable trickle current source to provide another trickle current and jumping to 120.

Eventually, a certain trickle current is selected and stage 140 is followed by stage 150 of resetting the adjustable delay unit to provide a certain delay period that differs from the default delay period.

Stage 150 is followed by stage 155 of analyzing the synthesized signal of the PLL in order to determine the noise level associated with the certain delay period.

Stage 155 is followed by query stage 160 of determining whether to (a) jump to stage 165 that includes defining a certain delay period as a selected delay period, or to (b) jump to stage 170. Stage 170 includes resetting the adjustable delay period to provide another delay period and jumping to stage 155.

Stage 165 is followed by stage 180 of storing the selected trickle current value and selected delay period in order to provide them during the operation of device 20.

Stage 180 can be followed by stage 185 of checking if the selected trickle current and selected delay were determined for each operational mode and if the answer is negative jumping to stage 190 of changing an operational mode of device 20 and jumping to stage 115.

It is noted that only the trickle current or only the delay period can be defined per operational mode. Accordingly method 100 can be revised in a manner that allows it to skip unnecessary adjustment and analysis iterations.

Figure 10:
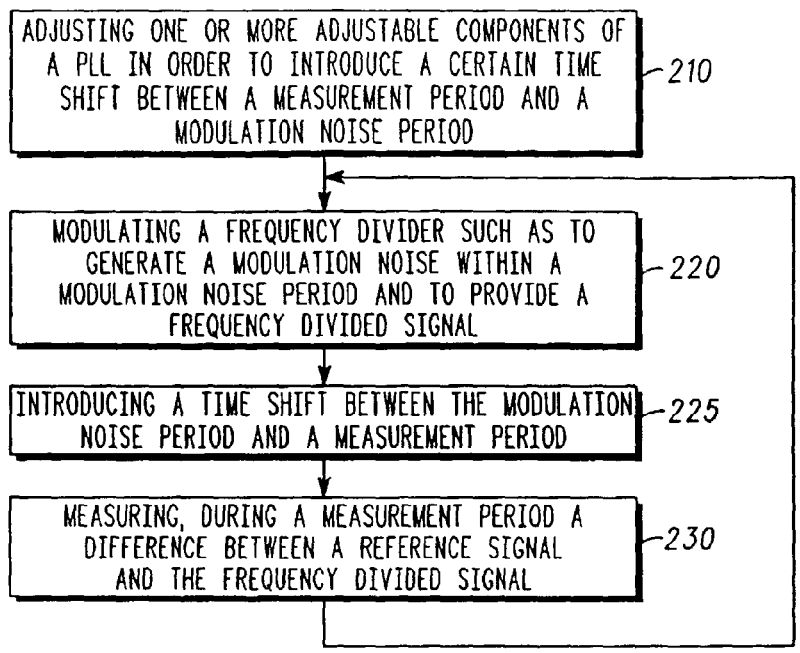
FIG. 10 and FIG. 11 illustrate methods for noise reduction, according to various embodiments of the invention.

FIG. 10 illustrates method 200 for noise reduction in a PLL, according to an embodiment of the invention.

Method 200 can be preceded by executing method 100, or at least some stages of method 100 such as to determine the selected trickle current and the selected delay period. It is noted that method 200 can track changes in the operational mode of a device and in response set an adjustable delay unit and an adjustable trickle current source accordingly.

Method 200 starts by stage 210 of adjusting one or more adjustable components of a PLL in order to introduce a certain time shift between a measurement period and a modulation noise period. Conveniently, an adjustable component is an adjustable delay unit, an adjustable trickle current source, and the like. WHA The time shift is conveniently introduced in order to reduce the noise level of $S_{synt}$. It is usually selected such as to escape from the dead zone of the charge pump.

Stage 210 is followed by stage 220. Stage 220 includes modulating a frequency divider such as to generate a modulation noise within a modulation noise period and to provide a frequency divided signal. Stage 220 is followed by stage 225 of introducing a time shift between the modulation noise period and a measurement period. Stage 225 is followed by stage 230. It is noted that stage 230 can precede stage 220.

Stage 230 includes measuring, during a measurement period a difference between a reference signal and the frequency divided signal.

It is noted that the modulation can include an operation that affects at least one parameter of the frequency division. This can be implemented by various modulators, including to sigma delta modulators, adders, integrators, and the like.

According to an embodiment of the invention stages 210-230 are repeated constantly during the operation of the PLL.

Figure 11:
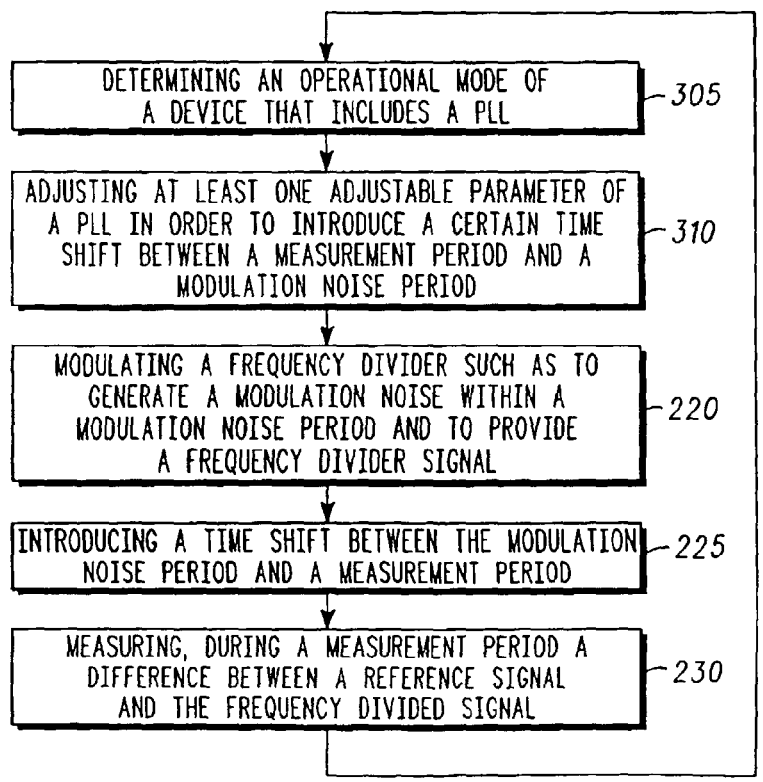

FIG. 11 illustrates a method 300 for noise reduction, according to an embodiment of the invention.

Method 300 starts by stage 305 of determining an operational mode of a device that includes a PLL. The determination can be made by a user of the device or by a control unit such as control unit 50.

Stage 305 is followed by stage 310 of adjusting at least one adjustable parameter of a PLL in order to introduce a certain time shift between a measurement period and a modulation noise period. This adjustable parameter is also responsive to the operational mode of the device. For example, stage 310 can include retrieving selected delay period and trickle current from a storage device such as memory 70 and setting an adjustable delay unit and an adjustable trickle current source.

Stage 310 is followed by stage 220. Stage 220 is followed by stage 225 and then by stage 230. The measurement period and the noise modulation period are time shifted from each other by the time shift that was introduced during stage 310.

Stage 230 can be followed by stage 305. Once the operational mode is changed the setting of the PLL can change accordingly.

It is noted that the method can be applied in addition to other noise reduction techniques, such as sigma delta modulation.

It is noted that if the device includes more than a single PLL then the time shift of at least one PLL can be adjusted in response to noise modulation periods of other PLLs. For example, assuming that the device include a first and second PLL then stages 210 and 310 of adjusting is responsive to a modulation noise period of the second PLL. Conveniently, either stage of adjusting (210, 310) a time shift of the second PLL is responsive to a modulation noise period of the first PLL.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for reducing noise in a device that comprises one or more phase locked loops (PLLs), the method comprises:

modulating a frequency divider, by a modulator that introduces a modulation noise within a modulation noise period, to provide a frequency divided signal;

introducing a time shift between the modulation noise period and a measurement period;

measuring, during a measurement period a difference between a reference signal and the frequency divided signal; and adjusting at least one adjustable component of a PLL such as to determine the time shift;

wherein the adjusting comprises adjusting an adjustable delay circuit within a phase detector of the PLL.

2. A method for reducing noise in a device that comprises one or more phase locked loops (PLLs), the method comprises:

modulating a frequency divider, by a modulator that introduces a modulation noise within a modulation noise period, to provide a frequency divided signal;

introducing a time shift between the modulation noise period and a measurement period;

measuring, during a measurement period a difference between a reference signal and the frequency divided signal; and adjusting at least one adjustable component of a PLL such as to determine the time shift;

wherein the adjusting comprises adjusting an adjustable trickle current source.

3. A method for reducing noise in a device that comprises one or more phase locked loops (PLLs), the method comprises:

modulating a frequency divider, by a modulator that introduces a modulation noise within a modulation noise period, to provide a frequency divided signal;

introducing a time shift between the modulation noise period and a measurement period;

measuring, during a measurement period a difference between a reference signal and the frequency divided signal; and adjusting at least one adjustable component of a PLL such as to determine the time shift;

wherein the introducing comprises counting a frequency reduced signal.

4. A method for reducing noise in a device that comprises one or more phase locked loops (PLLs), the method comprises:

modulating a frequency divider, by a modulator that introduces a modulation noise within a modulation noise period, to provide a frequency divided signal;

introducing a time shift between the modulation noise period and a measurement period;

measuring, during a measurement period a difference between a reference signal and the frequency divided signal; and adjusting at least one adjustable component of a PLL such as to determine the time shift;

wherein the time shift is selected in response to noise generated by components other than the PLL.

5. A device comprising at least one phased locked loop the phase locked loop (PLL) comprises:

a frequency divider, adapted to receive an output signal from a controlled oscillator and to provide a divided frequency signal;

a modulator, coupled to the frequency divider, adapted to affect at least one frequency division characteristic and to introduce a modulation noise during a modulation noise period;

a phase detector, adapted to measure, during a measurement period, a difference between a reference signal and the frequency divided signal;

an adjustable delay unit adapted to affect an adjustable time shift between the modulation period and the measurement period; and an adjustable trickle current source adapted to provide an adjustable trickle current to a charge pump that is coupled between the phase detector and a loop filter.

6. A device comprising at least one phased locked loop the phase locked loop (PLL) comprises:

a frequency divider, adapted to receive an output signal from a controlled oscillator and to provide a divided frequency signal;

a modulator, coupled to the frequency divider, adapted to affect at least one frequency division characteristic and to introduce a modulation noise during a modulation noise period;

a phase detector, adapted to measure, during a measurement period, a difference between a reference signal and the frequency divided signal;

an adjustable delay unit adapted to affect an adjustable time shift between the modulation period and the measurement period; and an adjustable delay circuit within a phase detector that is adapted to force the phase detector to generate control pulses even at an absence of phase difference between a reference signal and a frequency divided signal provided to the phase detector.

7. A device comprising at least one phased locked loop the phase locked loop (PLL) comprises:

a frequency divider, adapted to receive an output signal from a controlled oscillator and to provide a divided frequency signal;

a modulator, coupled to the frequency divider, adapted to affect at least one frequency division characteristic and to introduce a modulation noise during a modulation noise period;

a phase detector, adapted to measure, during a measurement period, a difference between a reference signal and the frequency divided signal; and an adjustable delay unit adapted to affect an adjustable time shift between the modulation period and the measurement period;

wherein the adjustable delay unit is preceded by a prescaler.

8. A device comprising at least one phased locked loop the phase locked loop (PLL) comprises:

a frequency divider, adapted to receive an output signal from a controlled oscillator and to provide a divided frequency signal;

a modulator, coupled to the frequency divider, adapted to affect at least one frequency division characteristic and to introduce a modulation noise during a modulation noise period;

a phase detector, adapted to measure, during a measurement period, a difference between a reference signal and the frequency divided signal;

an adjustable delay unit adapted to affect an adjustable time shift between the modulation period and the measurement period; and additional noisy components; wherein the adjustable time shift is determined in response to the noise of at least one additional noisy components.

9. A device comprising at least one phased locked loop the phase locked loop (PLL) comprises:

a frequency divider, adapted to receive an output signal from a controlled oscillator and to provide a divided frequency signal;

a modulator, coupled to the frequency divider, adapted to affect at least one frequency division characteristic and to introduce a modulation noise during a modulation noise period;

a phase detector, adapted to measure, during a measurement period, a difference between a reference signal and the frequency divided signal;

an adjustable delay unit adapted to affect an adjustable time shift between the modulation period and the measurement period; and a second PLL, wherein the time shift of the first PLL is adjusted in response to a modulation noise period of the second PLL.

10. A device comprising at least one phased locked loop the phase locked loop (PLL) comprises:

a frequency divider, adapted to receive an output signal from a controlled oscillator and to provide a divided frequency signal;

a modulator, coupled to the frequency divider, adapted to affect at least one frequency division characteristic and to introduce a modulation noise during a modulation noise period;

a phase detector, adapted to measure, during a measurement period, a difference between a reference signal and the frequency divided signal;

an adjustable delay unit adapted to affect an adjustable time shift between the modulation period and the measurement period; and a second PLL, wherein a time shift introduced between a measurement period of the second PLL and a modulation noise period of the second PLL is responsive to the modulation noise period of the first PLL.

11. A method for reducing noise in a device that comprises one or more phase locked loops (PLLs), the method comprises:

modulating a frequency divider, by a modulator that introduces a modulation noise within a modulation noise period, to provide a frequency divided signal;

introducing a time shift between the modulation noise period and a measurement period;

measuring, during a measurement period a difference between a reference signal and the frequency divided signal; and adjusting at least one adjustable component of a PLL such as to determine the time shift;

wherein the device comprises a second PLL and wherein the stage of adjusting is responsive to a modulation noise period of the second PLL.

12. A method for reducing noise in a device that comprises one or more phase locked loops (PLLs), the method comprises:

modulating a frequency divider, by a modulator that introduces a modulation noise within a modulation noise period, to provide a frequency divided signal;

introducing a time shift between the modulation noise period and a measurement period;

measuring, during a measurement period a difference between a reference signal and the frequency divided signal; and adjusting at least one adjustable component of a PLL such as to determine the time shift;

wherein the device comprises a second PLL and wherein a stage of adjusting a time shift of the second PLL is responsive to a modulation noise period of the first PLL.

* * * * *